(12) United States Patent
Chen et al.

(10) Patent No.: US 9,748,333 B2
(45) Date of Patent: Aug. 29, 2017

(54) SEMICONDUCTOR STRUCTURE INCLUDING DUMMY STRUCTURE AND SEMICONDUCTOR PATTERN STRUCTURE INCLUDING DUMMY STRUCTURE

(71) Applicant: UNITED MICROELECTRONICS CORP., Hsin-Chu (TW)

(72) Inventors: Shin-Chi Chen, Penghu County (TW); Chih-Yueh Li, Taipei (TW); Pei-Ching Yeh, Changhua County (TW); Chih-Jen Lin, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/583,575

(22) Filed: Dec. 26, 2014

(65) Prior Publication Data

US 2016/0148878 A1    May 26, 2016

(30) Foreign Application Priority Data

Nov. 24, 2014   (TW) .............................. 103140664 A

(51) Int. Cl.
   *H01L 27/088*   (2006.01)
   *H01L 21/764*   (2006.01)
   *H01L 29/06*    (2006.01)
   *H01L 29/78*    (2006.01)
   *H01L 21/28*    (2006.01)
(52) U.S. Cl.
   CPC .... *H01L 29/0653* (2013.01); *H01L 21/28123* (2013.01); *H01L 29/78* (2013.01)

(58) Field of Classification Search
   CPC ........... H01L 27/088; H01L 2924/0002; H01L 29/66545; H01L 29/0649; H01L 21/764
   See application file for complete search history.

(56) References Cited

U.S. PATENT DOCUMENTS

| 6,770,929 B2 | 8/2004 | Singh et al. | |
| 2006/0141715 A1* | 6/2006 | Park | H01L 21/823437 438/279 |
| 2006/0262599 A1* | 11/2006 | Wu | G11C 16/0416 365/185.05 |
| 2007/0015325 A1* | 1/2007 | Goldbach | H01L 21/823857 438/199 |
| 2008/0246102 A1* | 10/2008 | Yoshida | H01L 21/28097 257/412 |
| 2008/0248623 A1* | 10/2008 | Tsai | H01L 21/823412 438/276 |
| 2010/0258872 A1* | 10/2010 | Sugii | H01L 27/1203 257/350 |
| 2010/0302854 A1* | 12/2010 | Wu | G11C 11/34 365/185.18 |
| 2011/0248357 A1* | 10/2011 | Kwon | H01L 21/76229 257/392 |

(Continued)

*Primary Examiner* — Allen Parker
*Assistant Examiner* — Ismail Muse
(74) *Attorney, Agent, or Firm* — Winston Hsu

(57) ABSTRACT

A semiconductor pattern structure includes a substrate, an input/output (I/O) region defined on the substrate, a core region defined on the substrate, a dummy region defined on the substrate, and a gate electrode formed on the substrate. The dummy region is formed between the I/O region and the core region. The gate electrode crosses the I/O region and covers a portion of the dummy region.

18 Claims, 6 Drawing Sheets

(56) References Cited

U.S. PATENT DOCUMENTS

| | | | |
|---|---|---|---|
| 2012/0074479 A1* | 3/2012 | Wu | G11C 11/34 |
| | | | 257/298 |
| 2012/0225545 A1* | 9/2012 | Fu | H01L 21/823857 |
| | | | 438/585 |
| 2013/0037890 A1* | 2/2013 | Tseng | H01L 27/14689 |
| | | | 257/411 |
| 2013/0248997 A1* | 9/2013 | Jang | H01L 27/088 |
| | | | 257/334 |
| 2014/0042640 A1 | 2/2014 | Tsai et al. | |
| 2014/0061870 A1* | 3/2014 | Chen | H01L 29/401 |
| | | | 257/635 |
| 2014/0197480 A1* | 7/2014 | Han | H01L 29/7827 |
| | | | 257/330 |

* cited by examiner

SEMICONDUCTOR STRUCTURE INCLUDING DUMMY STRUCTURE AND SEMICONDUCTOR PATTERN STRUCTURE INCLUDING DUMMY STRUCTURE

BACKGROUND OF THE INVENTION

1. Field of the Invention

The invention relates to a semiconductor structure and semiconductor pattern structure, and more particularly, to a semiconductor structure and semiconductor pattern structure integrated with dummy structures.

2. Description of the Prior Art

The semiconductor integrated circuit (hereinafter abbreviated as IC) industry has experienced rapid growth, and the ICs become more complex and smaller than the previous generation. In the course of IC evolution, functional density has generally increased while geometry size has decreased.

This scaling down process generally provides benefits by increasing production efficiency and lowering process costs. However, it has also increased the complexity of processing/manufacturing for integrating devices of different kinds on one single die. Moreover, since the devices of different kinds are to be formed on one single die, it is found that processes for manufacturing different devices are often mutually influenced and devices are adversely impacted. Eventually, electrical performance of the whole IC is deteriorated.

Therefore, a semiconductor structure and a semiconductor pattern structure that are able to protect devices from being influenced in the complicated manufacturing processes and to ensure or improve IC performance are still in need.

SUMMARY OF THE INVENTION

According to the claimed invention, a semiconductor pattern structure is provided. The semiconductor pattern structure includes a substrate, an input/output (hereinafter abbreviated as I/O) region defined on the substrate, a core region defined on the substrate, a dummy region defined on the substrate, and a gate electrode formed on the substrate. The dummy region is formed between the I/O region and the core region. The gate electrode crosses the I/O region and covers a portion of the dummy region.

According to the claimed invention, a semiconductor structure is provided. The semiconductor structure includes a substrate, a dummy structure formed in the substrate, a first gate dielectric layer and a second gate dielectric layer formed on the dummy structure, and a gate electrode formed on the dummy structure. A thickness of the first gate dielectric layer is larger than a thickness of the second gate dielectric layer.

According to the semiconductor structure and the semiconductor pattern structure provided by the present invention, a dummy region is formed between the I/O region and the core region, and a dummy structure is formed in the dummy region. Furthermore, a first gate dielectric layer and a second gate dielectric layer, of which the thickness are different from each other, are formed on the dummy structure. It is well-known that in semiconductor manufacturing processes, etching process is prevalently used to form layers of different thickness required by different devices. The etching process not only removes the target layer(s), but also impacts other elements adjacent, near, or under the target(s). Therefore, the present invention provides the dummy structure formed between different device regions and the junction of the first gate dielectric layer and the second gate dielectric layer will be located on the dummy structure. When an etching process is performed to remove any of the layers, the dummy structure serves as a buffer, and the influences from the etching process are confined within the dummy region. Such that the substrate and other elements in the substrate are spared from being impacted. Accordingly, different devices are protected from adverse impact during the manufacturing processes. And thus the semiconductor structure and the semiconductor pattern structure provided by the present invention are ensured to have an even improved electrical performance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4-10 are schematic drawings illustrating a method for manufacturing a semiconductor structure and a semiconductor pattern structure provided by a preferred embodiment of the present invention, wherein FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

DETAILED DESCRIPTION

Figure 1:
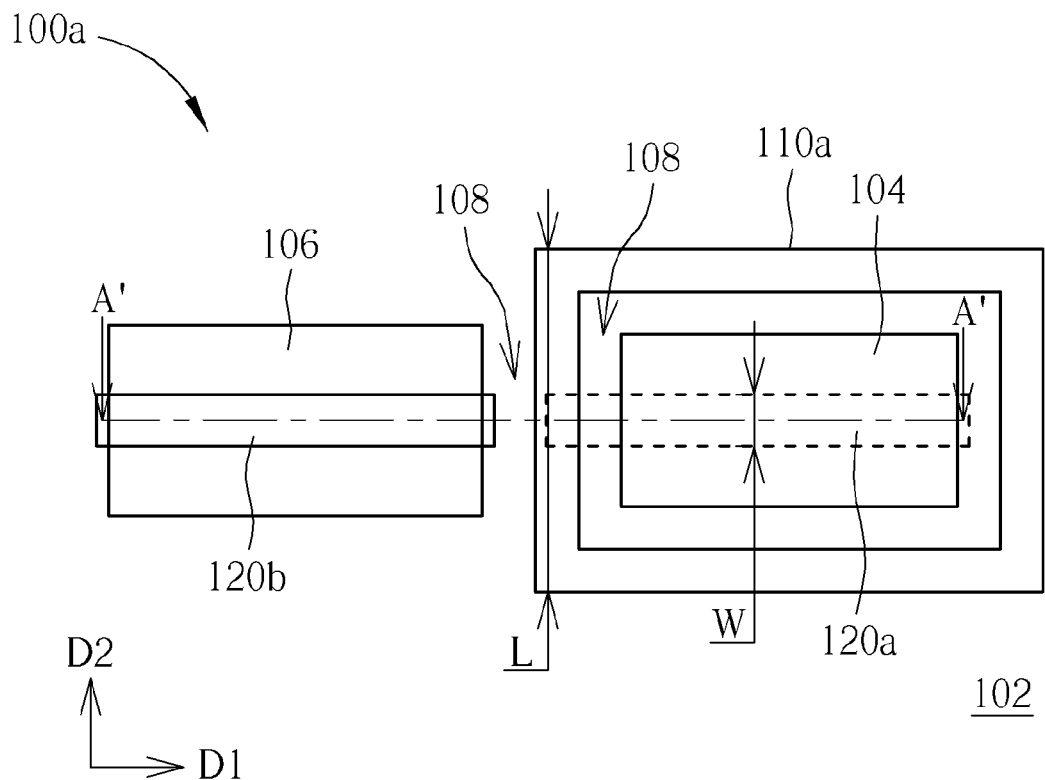
FIG. 1 is a schematic drawing illustrating a semiconductor pattern structure provided by a first preferred embodiment of the present invention.
Figure 2:
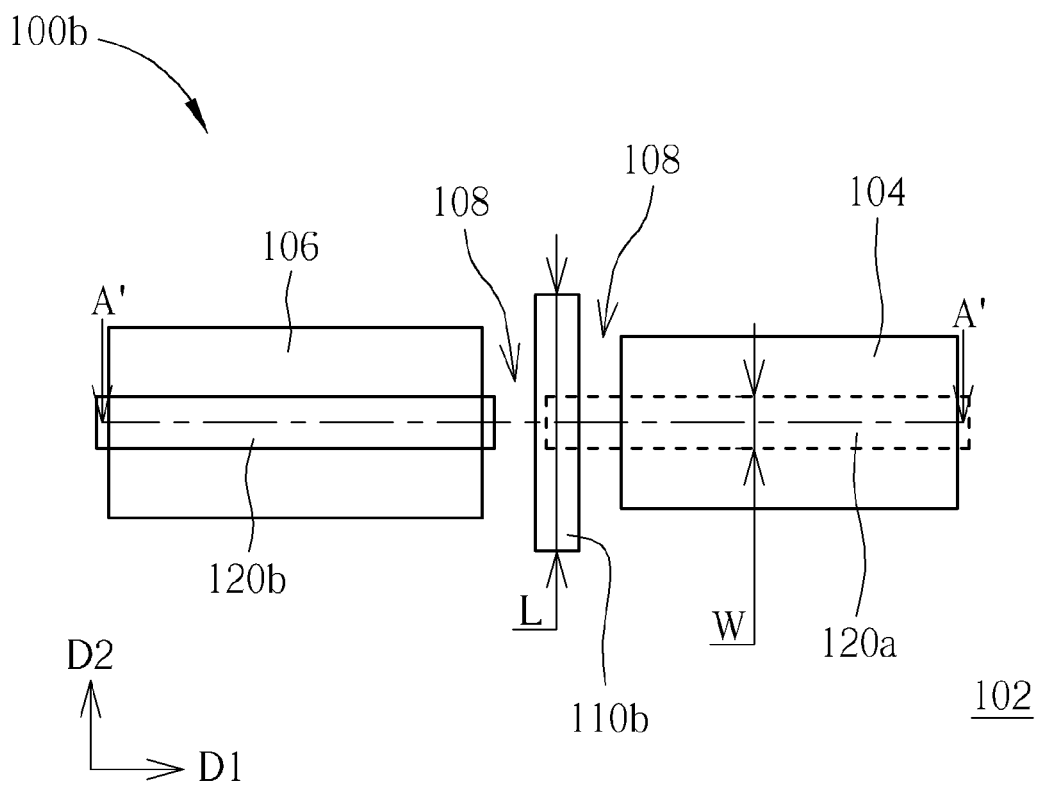
FIG. 2 is a schematic drawing illustrating a semiconductor pattern structure provided by a second preferred embodiment of the present invention.
Figure 3:
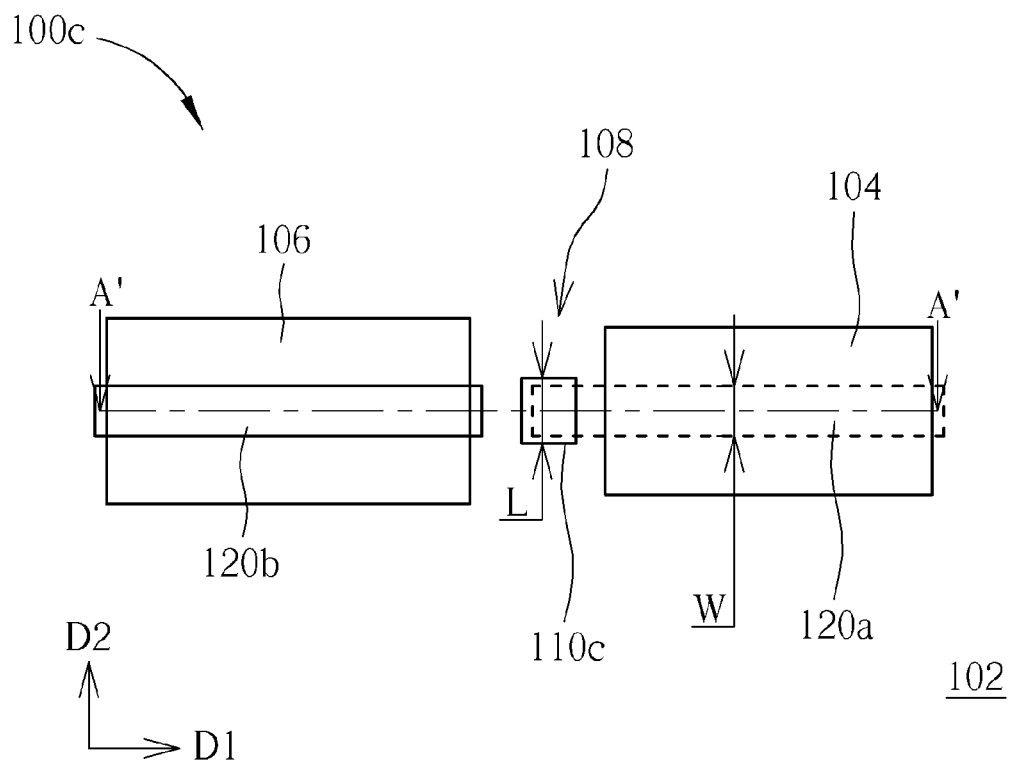
FIG. 3 is a schematic drawing illustrating a semiconductor pattern structure provided by a third preferred embodiment of the present invention.

Please refer to FIGS. 1-3, which are schematic drawings respectively illustrating a semiconductor pattern structure provided by a first, a second and a third preferred embodiments of the present invention. As shown in FIGS. 1-3, semiconductor pattern structures 100a, 100b, and 100c are provided by the present invention. The semiconductor pattern structures 100a, 100b, and 100c respectively include a substrate 102, an I/O region 104 defined on the substrate 102, and a core region 106 defined on the substrate 102. The I/O region 104 and the core region 106 are physically and electrically isolated from each other by an isolation structure 108 formed in the substrate 102. In the preferred embodiments, the isolation structure 108 preferably includes a shallow trench isolation (hereinafter abbreviated as STI), but not limited to this.

Please refer to FIGS. 1-3 again. The semiconductor pattern structures 100a, 100b, and 100c provided by the present invention further include a dummy region 110 (including 110a shown in FIG. 1, 110b shown in FIG. 2, and 110c shown in FIG. 3) formed in the substrate 102. As shown in FIG. 1, the dummy region 110 can include a dummy ring 110a formed between the I/O region 104 and the core region 106. Furthermore, the dummy ring 110a encompasses the I/O region 104. As shown in FIG. 2, the dummy region 110 can include a dummy bar 110b formed between the I/O region 104 and the core region 106. As shown in FIG. 3, the dummy region 110 can include a dummy island 110c formed between the I/O region 104 and the core region 106. More important, the I/O region 104, the core region 106 and the dummy region 110a/110b/110c are all isolated from each other by the isolation structure 108, as shown in FIGS. 1-3. According to the preferred embodiments, a dummy structure 110d (shown in FIGS. 4-10) is formed in the dummy region 110a/110b/110c, and the dummy structure 110d hereditarily obtains the ring, the bar, or the island profile. Additionally, the dummy structure 110d and the substrate 102 include a same material.

Please still refer to FIGS. 1-3. The semiconductor pattern structures 100a, 100b and 100c provided by the present invention further include a gate electrode 120a and a gate electrode 120b formed on the substrate 102. The gate electrode 120a is extended to cross the I/O region 104 and to cover a portion of the dummy region 110a/110b/110c while the gate electrode 120b is extended to cross the core region 106. The gate electrodes 120a and 120b are extended along a first direction D1, and respectively include a width W. It is well-known to those skilled in the art, the width W of the gate electrodes 120a and 120b is the channel length of a transistor. The dummy region 110a/110b/110c and the dummy structure 110d formed therein include a length L, and the length L is parallel with a second direction D2. The second direction D2 is perpendicular to the first direction D1. In other words, the length L of the dummy region 110a/110b/110c and of the dummy structure 110d formed therein is perpendicular to the extending direction of the gate electrodes 120a and 120b. More important, the length L of the dummy region 110a/110b/110c and the dummy structure 110d formed therein is larger than the width W of the gate electrode 120a. For example but not limited to, the length L can be larger than 50 nanometer (nm).

According to the semiconductor pattern structures 100a, 100b and 100c provided by the present invention, the dummy region 110a/110b/110c and the dummy structure formed therein are formed between the I/O region 104 and the core region 106, and are used as a buffer in gate electrode formation and its related fabricating processes. For example, the dummy region 110a/110b/110c and the dummy structure formed therein serve as the buffer when forming the gate dielectric layers of different thickness. Therefore, different devices, such as the high-voltage (HV) device formed in the I/O region 104 and integrated devices formed in the core region 106, are protected from adverse impacts in the manufacturing processes. And thus the electrical performance of the integrated circuit is ensure and improved.

Figure 4:
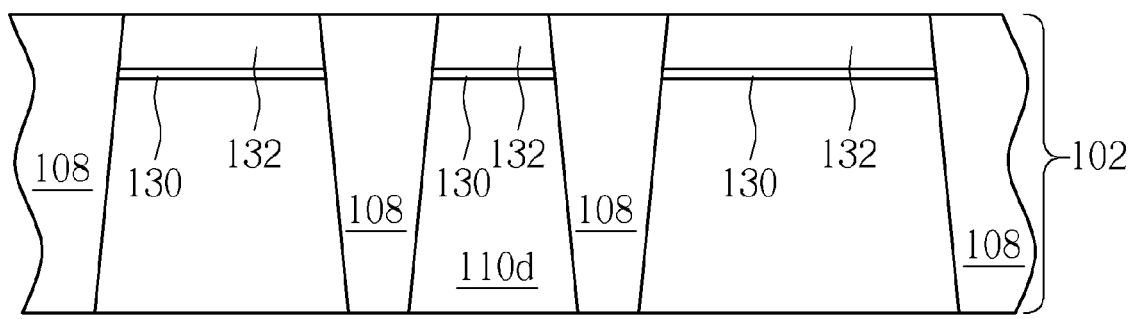

Please refer to FIGS. 4-10, which are schematic drawings illustrating a method for manufacturing a semiconductor structure and a semiconductor pattern structure provided by a preferred embodiment of the present invention. As shown in FIG. 4, the preferred embodiment provides a substrate 102. The substrate 102 can include a semiconductor substrate such as a silicon substrate, silicon-containing substrate, silicon-on-insulator (SOI) substrate, but not limited to this. Next, a pad layer 130 and a patterned hard mask 132 are formed on a surface of the substrate 102. In the preferred embodiment, the pad layer 130 can include silicon oxide, and the patterned hard mask 132 can include silicon nitride, but not limited to this. The patterned hard mask 132 is used to define an amount, locations, and sizes of a plurality of trenches. Subsequently, a proper etching process is used to etch the pad layer 130 and the substrate 102 through the patterned hard mask 132, and thus a plurality of trenches (not shown) is formed in the substrate 102. The trenches are then filled up with an insulating material, preferably a silicon oxide. Next, a planarization is performed to remove superfluous insulating material. Consequently, a plurality of isolation structures 108 (STIs 108), are formed in the substrate 102, and a planar surface is obtained as shown in FIG. 4.

Please still refer to FIG. 4. It is noteworthy a first region 104, a second region 106 and a third region 110 are defined by the isolation structures 108. In the preferred embodiment, the first region 104 can be an I/O region 104, the second region 106 can be a core region 106, and the third region 110 can be a dummy region 110. Furthermore, the I/O region 104, the core region 106, and the dummy region 110 are physically and electrically isolated from each other by the isolation structures 108. More important, a portion of the substrate located in the dummy region 110 serves as a dummy structure 110d. In other words, the dummy structure 110d is disposed in the substrate 102, and the dummy structure 110d and the substrate 102 include a same material, but not limited to this. As shown in FIG. 4, the isolation structure 108 is formed at least at two opposite sides of the dummy structure 110d. Furthermore, when the substrate 102 is a SOI substrate, the dummy structure 110d is electrically floated. That is, the dummy structure 110d is electrically isolated from any device or component.

Figure 5:
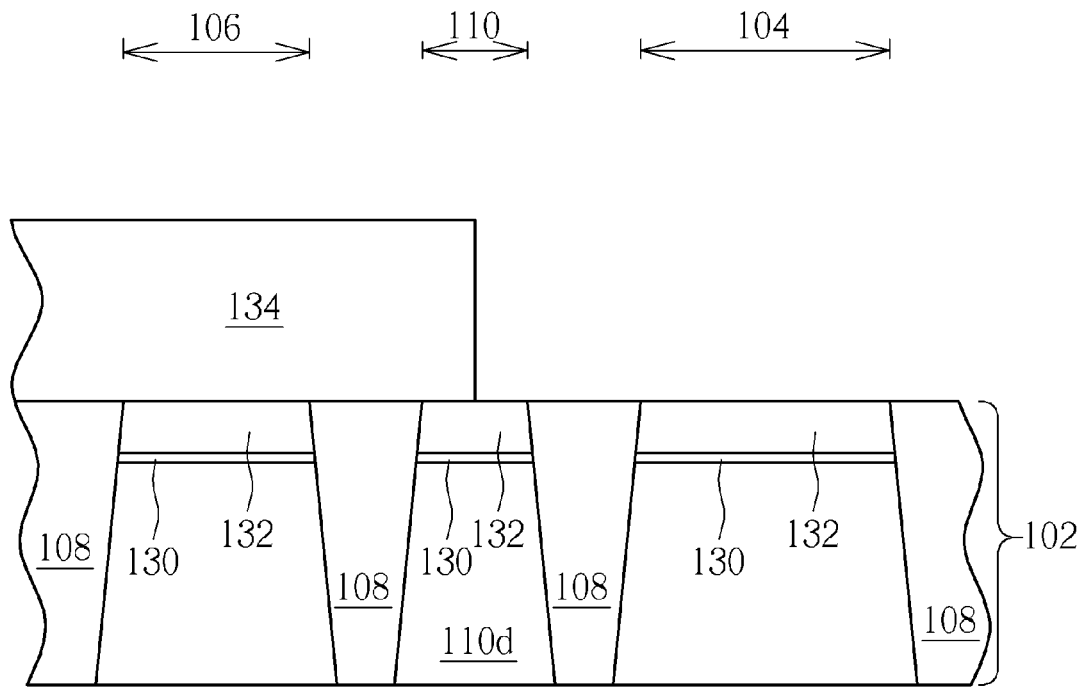
Figure 6:
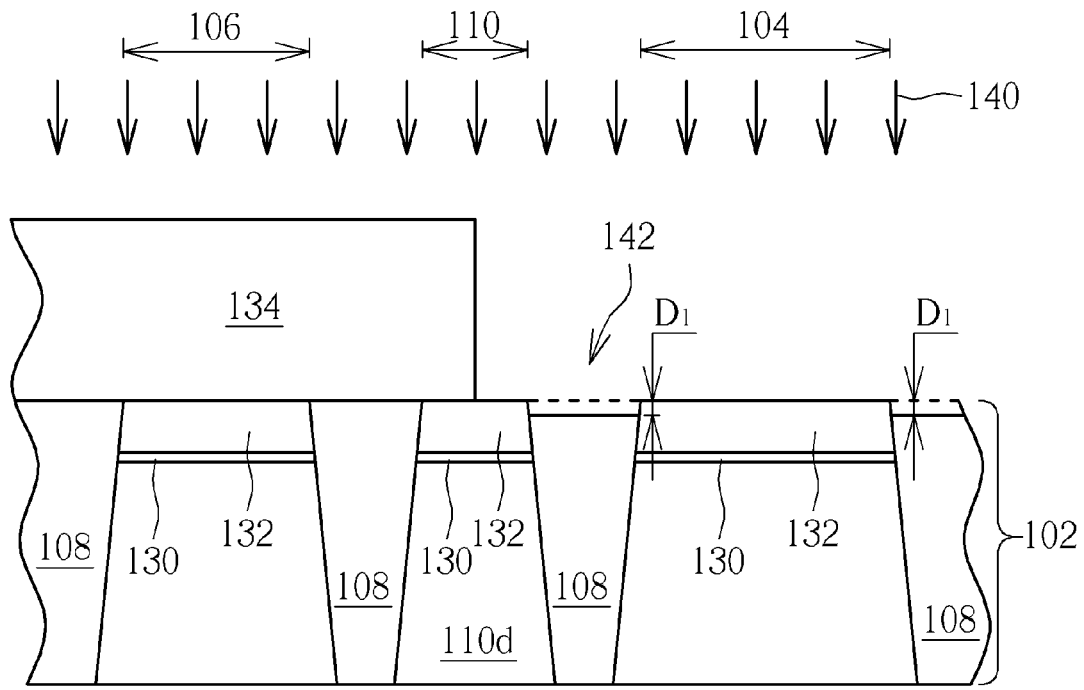

Please refer to FIG. 5 and FIG. 6. Next, a patterned photoresist 134 is formed on the substrate 102. The patterned photoresist 134 covers the entire core region 106 and a portion of the dummy region 110. But, the I/O region 104 is exposed as shown in FIG. 5. Then, an etching process 140 is performed to remove a portion of the STI 108, particularly to remove a portion of the STI 108 located between the dummy region 110 and the I/O region 104, and thus a recess 142 is obtained. As shown in FIG. 6, the recess 142 includes a depth $D_1$. It is noteworthy that because the STI 108 includes silicon oxide and the patterned hard mask 132 includes silicon nitride, the I/O region 104 covered and protected by the patterned hard mask 132 is impervious to the etching process 140. As shown in FIG. 6, only the exposed portion of the STIs 108 is removed by the etching process 140.

Figure 7:
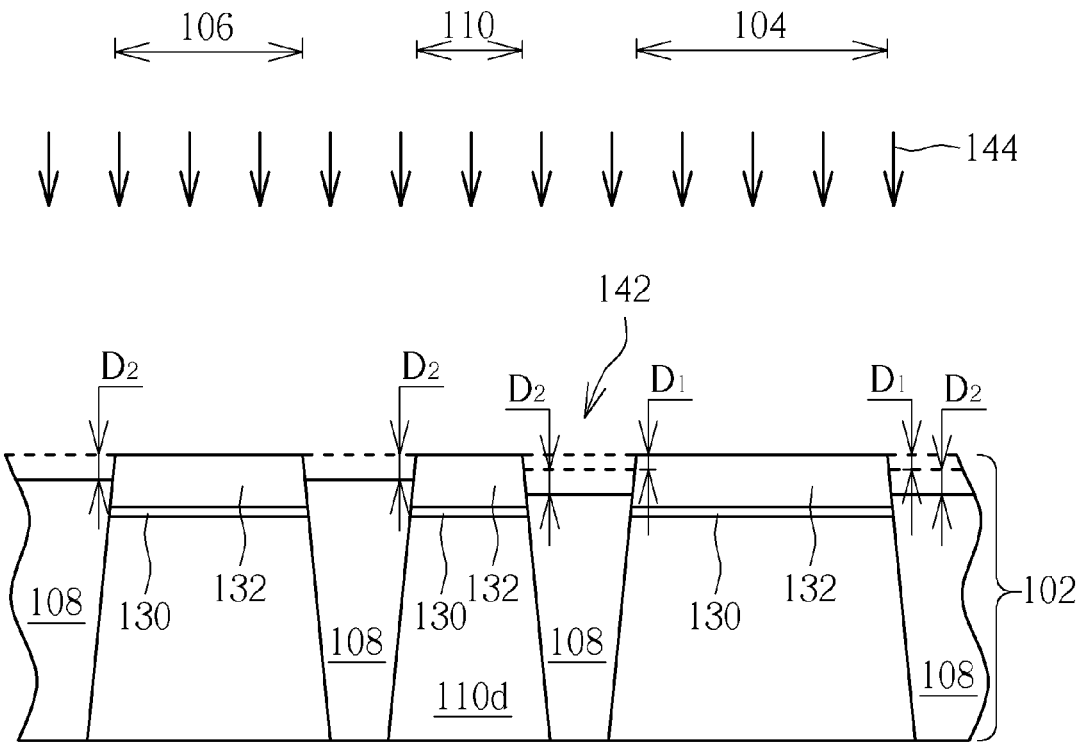

Please refer to FIG. 7. After the etching process 140, the patterned photoresist 134 is removed and an etching back process 144 is performed. As shown in FIG. 7, the etching back process 144 removes an equivalent portion of all STIs 108. As shown in FIG. 7, a depth $D_2$ is formed in all of the STIs 108 by the etching back process 144. Furthermore, the recess 142 is deepened by the etching back process 144 and thus the depth of the recess 142 is a sum of the depth $D_1$ and the depth $D_2$. Additionally, the I/O region 104 and the core region 106, which are still covered and protected by the patterned hard mask 132 are impervious to the etching back process 144.

Figure 8:
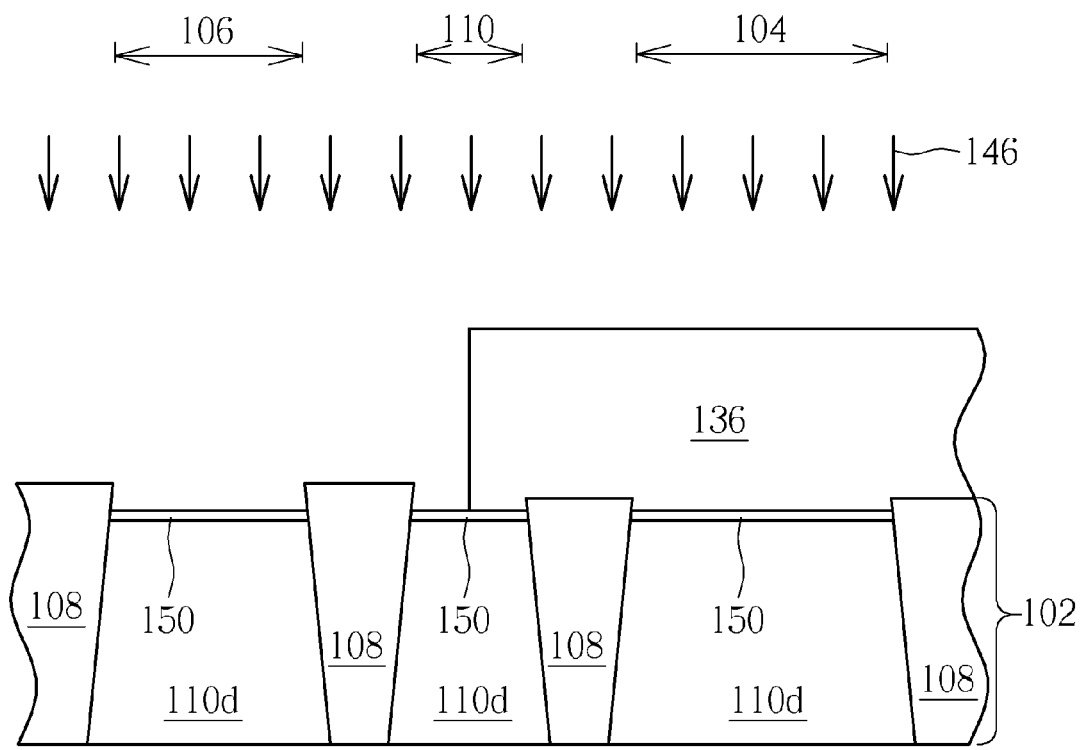
Figure 9:
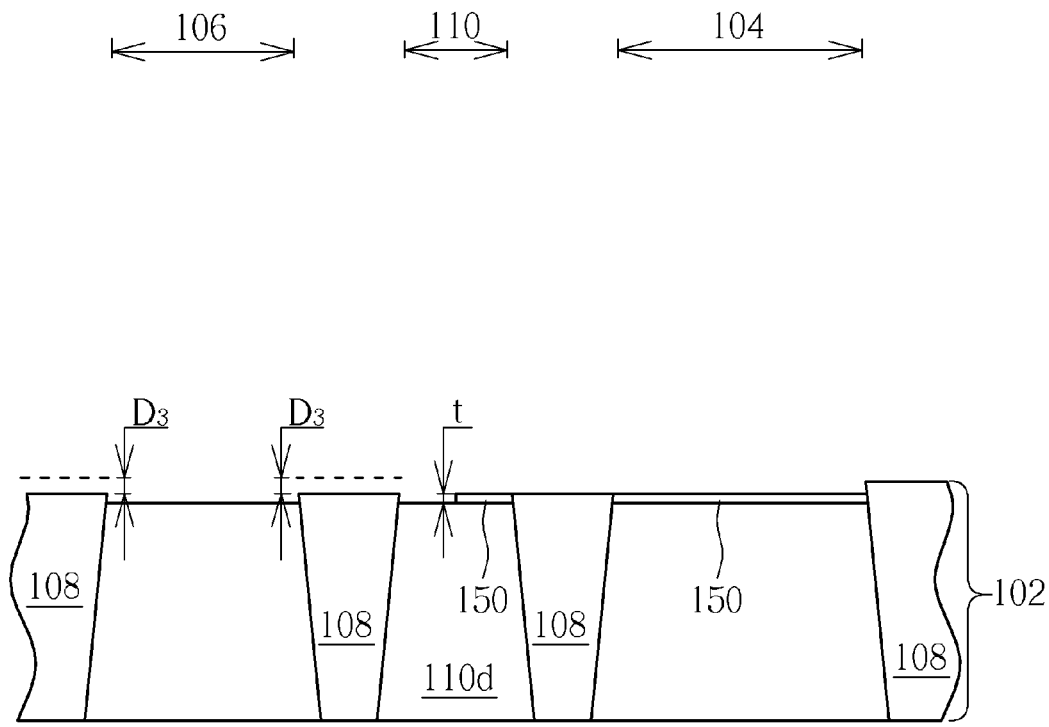

Please refer to FIG. 8 and FIG. 9. Next, the patterned hard mask 132 is removed and followed by performing ion implantation(s) to the substrate 102. Consequently, doped region(s)/well(s) (not shown) are formed. The pad layer 130 is then removed so that the surface of the substrate is exposed. Please refer to FIG. 8 again. After removing the pad layer 130, a thermal oxidation process is performed to form a first insulating layer 150 on the exposed surface of the substrate 102. Subsequently, a patterned photoresist 136 is formed on the substrate 102. As shown in FIG. 8, the patterned photoresist 136 covers the entire I/O region 104 but exposes the core region 106. More important, the margin of the patterned photoresist 136 is formed within the dummy region 110 according to the preferred embodiment. After forming the patterning photoresist 136, an etching process 146 is performed to remove the exposed first insulating layer 150. That is, the etching process 146 removes the first insulating layer 150 from the core region 106 and a portion of the first insulating layer 150 from the dummy structure 110d. It is noteworthy that because both of the STIs 108 and the first insulating layer 140 include silicon oxide, the exposed STIs 108 are also etched in the etching process 146. An etched depth $D_3$ of the STIs 108 is equal to a thickness "t" of the first insulating layer 150. Please refer to FIG. 9 and FIG. 6, simultaneously. As mentioned above, the etching process 140 is to remove the portion of the STI 108 between the dummy region 110 and the I/O region 104 and thus the recess 142 having the depth $D_1$ is obtained. In the preferred embodiment, the depth $D_1$ of the recess 142 preferably is equal to the thickness "t" of the first insulating layer. Furthermore, the exposed STIs 108 are etched during removing the portion of the first insulating layer 150 by the etching process 146, and the etched depth $D_3$ of the STI 108 is equal to the thickness "t" of the first insulating layer 104. Eventually, the STIs 108 between the I/O region 104, the dummy region 110 and the core region 106 include a same protruded height. Consequently, surface flatness of the substrate 102 is improved.

It should be noted that because the margin of the patterned photoresist 136 is located within the dummy region 110 according to the preferred embodiment, the etching process 146 spontaneously stops at the dummy structure 110d after the first insulating layer 150 is removed from the dummy region 110. In a case that when a STI 108, instead of the dummy structure 110d, is formed between the I/O region 104 and the core region 106, the etching process 146 is to etch and consume the STI 108 after the first insulating layer 150 is removed from the core region 106, because the STI 108 includes an etching rate the same with the first insulating layer 150. To prevent such problem, the margin of the patterned photoresist 136 must be aligned with a margin of the core region 136. Thus, the process window is reduced. It should be easily realized that once the margin of the patterned photoresist 136 is located within the STI 108, the STI 108 will be etched and consumed after the first insulating layer 150 is removed. Finally, a step height between the substrate 102 and the STI 108 is resulted and the surface flatness of the substrate is deteriorated.

However, due to the dummy region 110 and the dummy structure 110d formed therein, a buffer region between the I/O region 104 and the core region 106 is gained. As long as the margin of the patterned photoresist 136 is located within the dummy region 110, the etching process 146 is to spontaneously stop at the dummy structure 110d. Consequently, process control is simplified and the process window is improved.

Figure 10:
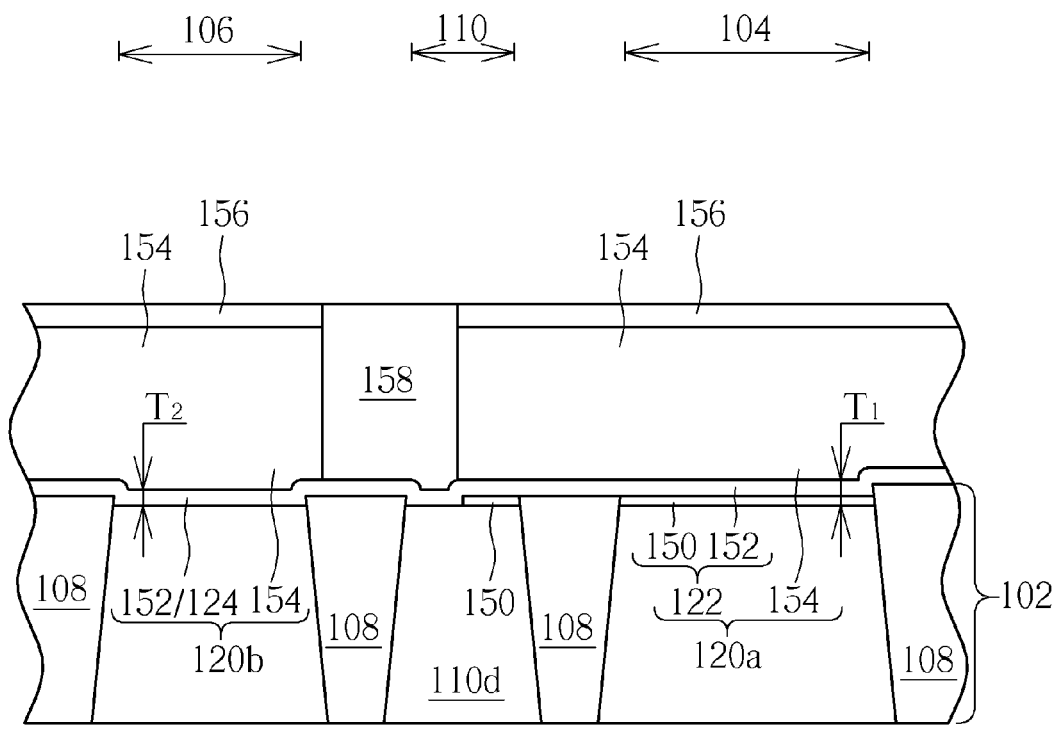

Please refer to FIG. 10. It should be easily realized that FIG. 10 can be a cross-sectional view of A-A' line respectively in FIGS. 1-3. As shown in FIG. 10, a second insulating layer 152, a gate layer 154 and a patterned hard mask 156 is sequentially formed on the substrate 102. According to the preferred embodiment, the second insulating layer 152 can be a high-k gate dielectric layer, but not limited to this. The gate layer 154 can be a polysilicon layer, but not limited to this. The gate layer 154 is then etched through the patterned hard mask 156. Consequently, a gate electrode 120a is formed in the I/O region 104, and a gate electrode 120b is formed in the core region 106, simultaneously. As shown in FIG. 10, the first insulating layer 150 and the second insulating layer 152 stacked on the dummy structure 110d and in the I/O region 104 are taken as a first gate dielectric layer 122 while the second insulating layer 152 formed on the dummy structure 110d and in the core region 106 is taken as a second gate dielectric layer 124. In other words, both of the first gate dielectric layer 122 and the second gate dielectric layer 124 are formed on the dummy structure 110d, and the first gate dielectric layer 122 and the second gate dielectric layer 124 on the dummy structure 110d are adjacent and contact each other. More important, a thickness $T_1$ of the first gate dielectric layer 122 is larger than a thickness $T_2$ of the second gate dielectric layer 124. The thicker first gate dielectric layer 122 is extended into the first region (that is the I/O region 104) while the thinner second gate dielectric layer 124 is extended into the second region (that is the core region 106). Furthermore, the gate electrode 120a is formed only in the I/O region 104 but also extended into the dummy region 110, and disposed on the dummy structure 110d. Thereafter, elements such as source/drain (not shown) are formed in the substrate 102 and followed by forming an interlayer dielectric (abbreviated as ILD) layer 158 on the substrate 102. A planarization process is then performed to remove superfluous material, as shown in FIG. 10.

It is noteworthy that because the dummy region 110 and the dummy structure 110d formed therein are disposed between the I/O region 104 and the core region 106, coplanarity between the ILD layer 158 and the gate electrode 110 is improved. As mentioned above, in the case that there is formed the STI 108, instead of the dummy structure 110d, between the I/O region 104 and the core region 106, a step height is formed between the substrate 102 and the STI 108 located between the I/O region 104 and the core region 106 after the etching process 146. Such step height renders severe impacts to the planarization for planarizing the ILD layer 158: A portion of the gate electrode 120a will be covered by the ILD layer 158. This result will cause further problem: When metal gate approach is adopted, the patterned hard mask 156 and the gate layer 154 are to be removed. However, the gate layer 154 cannot be completely removed because the gate electrode 120a is covered by the ILD layer 158. For completely removing the gate layer 154, over-etching issue in the I/O region 104 is generated. And the thickness, quality, and characteristics of the first gate dielectric layer 122 are all severely impacted and thus the process yield is adversely affected.

Figure 11:
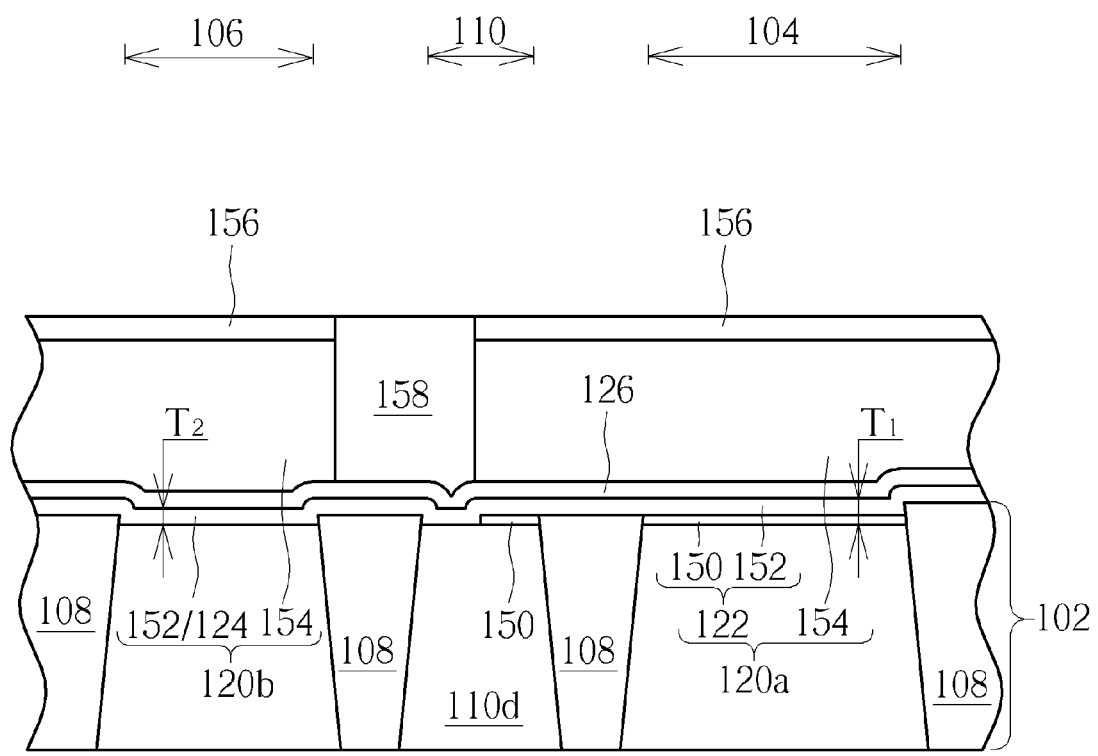
FIG. 11 is a schematic drawing illustrating a modification to the preferred embodiment of the present invention.

Please refer to FIG. 10 again. The method for manufacturing semiconductor structure and semiconductor pattern structure provided by the preferred embodiment adopts metal can be integrated with metal gate approach. Therefore, the patterned hard mask 156 and the gate layer 154 in the I/O region 104 and the core region 106 are removed after planarizing the ILD layer 158. Consequently, at least a gate trench (not shown) is respectively formed in the I/O region 104 and the core region 106. In a modification to the preferred embodiment, a high-k first approach is involved, and thus the first gate dielectric layer 122 and the second gate dielectric layer 124 include a high-k gate dielectric layer, respectively. Please refer to FIG. 11, which is a schematic drawing illustrating a modification to the preferred embodiment of the present invention. In the modification to the preferred embodiment, a high-k last approach is involved, thus the first gate dielectric layer 122 and the second gate dielectric layer 124 include a thermal oxide layer and a high-k gate dielectric layer 126 is further formed and directly stacked on the first gate dielectric layer 122 and the second gate dielectric layer 124. Thereafter, layers required by the metal gate approach such as barrier layer(s), work function metal layer(s) and gap-filling metal layer can be formed in the gate trenches.

According to the semiconductor structure and the semiconductor pattern structure provided by the present invention, a dummy region is formed between the I/O region and the core region, and a dummy structure is formed in the dummy region. Furthermore, a first gate dielectric layer and a second gate dielectric layer, of which the thickness are different from each other, are formed on the dummy structure. It is well-known that in semiconductor manufacturing processes, etching process is prevalently used to form layers of different thickness required by different devices. The etching process not only removes the target layer(s), but also impacts other elements adjacent, near, or under the target(s). Therefore, the present invention provides the dummy structure formed between different device regions and the junction of the first gate dielectric layer and the second gate dielectric layer will be located on the dummy structure. When an etching process is performed to remove any of the layers, the dummy structure serves as a buffer, and the influences from the etching process are confined within the dummy region. Such that the substrate and other elements in the substrate are spared from being impacted. Accordingly, different devices are protected from adverse impact during the manufacturing processes. And thus the semiconductor structure and the semiconductor pattern structure by the present invention ensure and even improve the electrical performance of the IC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor pattern structure comprising:
    a substrate;
    an input/output (I/O) region defined on the substrate;
    a core region defined on the substrate;
    an isolation structure formed in the substrate;
    a dummy region defined on the substrate, the dummy region being formed between the I/O region and the core region, and the dummy region being fully surrounded by the isolation structure in a top view;
    a first gate electrode formed on the substrate, the first gate electrode crossing the I/O region and covering a portion of the dummy region; and
    a second gate electrode formed on the substrate, the second gate electrode crossing the core region and being spaced apart from the first gate electrode on the dummy region.

2. The semiconductor pattern structure according to claim 1, further comprising a dummy structure formed in the dummy region, and the dummy structure and the substrate comprising a same material.

3. The semiconductor pattern structure according to claim 1, wherein the dummy region includes a dummy ring, a dummy bar, or a dummy island.

4. The semiconductor pattern structure according to claim 3, wherein when the dummy structure comprises the dummy ring, the dummy ring encompasses the I/O region.

5. The semiconductor pattern structure according to claim 1, wherein the dummy region comprises a length, and the length is perpendicular to an extending direction of the first gate electrode.

6. The semiconductor pattern structure according to claim 5, wherein the length of the dummy region in a top view is larger than a width of the first gate electrode in a top view.

7. The semiconductor pattern structure according to claim 5, wherein the length of the dummy region is larger than 50 nanometer (nm).

8. The semiconductor pattern structure according to claim 1, further comprising at least an isolation structure formed in the substrate.

9. The semiconductor pattern structure according to claim 8, wherein the I/O region, the core region and the dummy region are isolated from each other by the isolation structure.

10. A semiconductor structure comprising:
    a substrate comprising a first region and a second region defined thereon, wherein the first region comprises an I/O region and the second region comprises a core region;
    a dummy structure formed between the first region and the second region in the substrate, wherein the dummy structure and the substrate are formed of a same material;
    a first gate dielectric layer and a second gate dielectric layer formed on the dummy structure, a thickness of the first gate dielectric layer being larger than a thickness of the second gate dielectric layer, a bottom of the first gate dielectric layer and a bottom of the second gate dielectric layer being coplanar;
    a gate electrode formed on the dummy structure; and
    an interlayer dielectric (ILD) layer formed to overlap the dummy structure with the first gate dielectric layer there in-between.

11. The semiconductor structure according to claim 10, further comprising an isolation structure formed in the substrate, the isolation structure being formed at least at two opposite sides of the dummy structure.

12. The semiconductor structure according to claim 10, wherein the dummy structure is electrically floated.

13. The semiconductor structure according to claim 10, wherein the first gate dielectric layer is extended into the first region and the second gate dielectric layer is extended into the second region.

14. The semiconductor structure according to claim 10, wherein the gate electrode is extended into the I/O region.

15. The semiconductor structure according to claim 10, wherein the first gate dielectric layer and the second gate dielectric layer are adjacent and contact each other on the dummy structure.

16. The semiconductor structure according to claim 10, wherein the first gate dielectric layer and the second gate dielectric layer comprise a high-k gate dielectric layer, respectively.

17. The semiconductor structure according to claim 10, wherein the first gate dielectric layer and the second gate dielectric layer comprise at least a thermal oxide layer.

18. The semiconductor structure according to claim 17, further comprising a high-k gate dielectric layer directly formed on the first gate dielectric layer and the second gate dielectric layer.

* * * * *